United States Patent
Sin et al.

(10) Patent No.: US 8,981,460 B2
(45) Date of Patent: Mar. 17, 2015

(54) POWER SEMICONDUCTOR FIELD EFFECT TRANSISTOR STRUCTURE WITH CHARGE TRAPPING MATERIAL IN THE GATE DIELECTRIC

(75) Inventors: Johnny Kin On Sin, Kowloon (HK); Xianda Zhou, Kowloon (HK)

(73) Assignee: The Hong Kong University of Science and Technology, Kowloon (HK)

( * ) Notice: Subject to any disclaimer, the term of this patent is extended or adjusted under 35 U.S.C. 154(b) by 0 days.

(21) Appl. No.: 13/883,753

(22) PCT Filed: Dec. 20, 2011

(86) PCT No.: PCT/CN2011/002140
§ 371 (c)(1),
(2), (4) Date: May 6, 2013

(87) PCT Pub. No.: WO2012/083590
PCT Pub. Date: Jun. 28, 2012

(65) Prior Publication Data
US 2013/0256747 A1      Oct. 3, 2013

Related U.S. Application Data

(60) Provisional application No. 61/457,067, filed on Dec. 20, 2010.

(51) Int. Cl.
*H01L 29/792* (2006.01)
(52) U.S. Cl.
USPC ........... 257/324; 257/142; 257/184; 257/316; 257/326
(58) Field of Classification Search
CPC .............. H01L 29/782; H01L 29/1095; H01L 29/7926
USPC .................................. 257/142, 316, 324–326
See application file for complete search history.

(56) References Cited

U.S. PATENT DOCUMENTS

| | | | |
|---|---|---|---|
| 3,428,875 | A | 2/1969 | Snow |
| 3,590,272 | A | 6/1971 | Keshavan |

(Continued)

FOREIGN PATENT DOCUMENTS

| | | |
|---|---|---|
| CN | 1478302 A | 2/2004 |
| CN | 1527369 A | 9/2004 |
| JP | 2000150875 A | 5/2000 |

OTHER PUBLICATIONS

Ji, et al. "New Power MOSFET Employing Segmented Trench Body Contact for Improving the Avalanche Energy." Proceedings of the 20th International Symposium on Power Semiconductor Devices & IC's, May 18-22, 2008 Oralando, FL, pp. 115-118.
(Continued)

*Primary Examiner* — Dung A. Le
(74) *Attorney, Agent, or Firm* — Amin, Turocy & Watson, LLP (57) ABSTRACT

The subject disclosure presents power semiconductor devices, and methods for manufacture thereof, with improved ruggedness and. In an aspect, the power semiconductor devices are power field effect transistors (FETs) having enhanced suppression of the activation of the parasitic bipolar junction transistor (BJT) and a normal threshold value. The devices comprise a doped source (14) of a first conductivity type, a doped body (15) of a second conductivity type, a source electrode (20) short-connecting the doped body and the doped source, a doped drift region (10) of the first conductivity type, a first layer (30) of a gate dielectric region (36) covering the surface of the doped drift region (10), and forming channel from the doped source (14) to the doped drift region (10), a second layer (31) of the gate dielectric region (36) over the first layer (30), a third layer (32) of the gate dielectric region (36) over the second layer (31), and a gate electrode (21) over the third layer (32).

39 Claims, 10 Drawing Sheets

(56) References Cited

U.S. PATENT DOCUMENTS

| | | | |
|---|---|---|---|
| 4,587,713 | A | 5/1986 | Goodman et al. |
| 5,119,153 | A | 6/1992 | Korman et al. |
| 5,714,766 | A | 2/1998 | Chen et al. |
| 6,103,572 | A | 8/2000 | Kirihara |
| 8,823,080 | B2 * | 9/2014 | Yasuda .......................... 257/324 |
| 2009/0159927 | A1 | 6/2009 | Willmeroth et al. |

OTHER PUBLICATIONS

Kocon, et al. "Implant Spacer Optimization for the Improvement of Power MOSFETs' Unclamped Inductive Switching (UIS) and High Temperature Breakdown." ISPSO'2000, The 12th International Symposium on Power Semiconductor Devices and ICs, 2000. Proceedings. May 22-25, 2000, Toulouse, France. pp. 157-160.

Zeng, et al. "An Improved Power MOSFET Using a Novel Split Well Structure." The 11th International Symposium on Power Semiconductor Devices and ICs, 1999. ISPSD '99. Proceedings. May 26, 1999-May 28, 1999, pp. 205-208.

Narazaki, et al. "A Marvelous Low on-resistance 20V rated Self Alignment Trench MOSFET (SAT-MOS) in a 0.35μm LSI design rule with both high forward blocking voltage yield and large current capability." Proceedings of 2004 16th International Symposium on Power Semiconductor Devices & ICs, Kitakyushu, May 24-27, 2004, pp. 393-396.

Ng, et al. "A New Trench Power MOSFET With an Inverted L-Shaped Source Region." IEEE Electron Device Letters, vol. 31, No. 11, Nov. 2010, pp. 1284-1286.

International Search Report dated Mar. 29, 2012 for PCT Application PCT/CN2011/002140, 5 pages.

Zhou, et al. "A Novel SONOS Gate Power MOSFET With Excellent UIS Capability" IEEE Electron Device Letters Oct. 2011, vol. 32, No. 10. pp. 1415-1417.

* cited by examiner

POWER SEMICONDUCTOR FIELD EFFECT TRANSISTOR STRUCTURE WITH CHARGE TRAPPING MATERIAL IN THE GATE DIELECTRIC

PRIORITY CLAIM

This application is a U.S. National Stage of PCT Application Serial No. PCT/CN2011/002140, filed on Dec. 20, 2011, entitled "POWER SEMICONDUCTOR FIELD EFFECT TRANSISTOR STRUCTURE WITH CHARGE TRAPPING MATERIAL IN THE GATE DIELECTRIC", which claims priority to U.S. Provisional Application Ser. No. 61/457,067 filed on Dec. 20, 2010, entitled "POWER SEMICONDUCTOR FIELD EFFECT TRANSISTOR STRUCTURES WITH CHARGE TRAPPING MATERIAL IN THE GATE DIELECTRIC." The entireties of the aforementioned applications are incorporated by reference herein.

TECHNICAL FIELD

This disclosure relates generally to power device structures, e.g., r to power field effect transistor (FET) structures with heavily doped body and charge trapping material in the gate dielectric.

BACKGROUND

Field effect transistors, such as n-channel power metal-oxide-semiconductor field effect transistors (MOSFETs), are generally desired to have low conduction and switching losses in many power applications. Field effect transistors should also be rugged enough to prevent the parasitic bipolar junction transistor from turning on under high current conditions, such as unclamped inductive switching (UIS). The failure of MOSFETs during UIS is due to activation of the parasitic NPN bipolar transistor in breakdown mode.

The parasitic NPN bipolar junction transistor (BJT) in the power MOSFET is composed of the n+-source, p-body and n--drift, and these three regions also act as the emitter, base and collector of the parasitic bipolar junction transistor, respectively. The p-body is connected to the source electrode through a p+ region, and the n+-source/p-body junction is shorted at the source electrode of the device. The n+-source/p-body junction will not be forward biased at the static on-state or off-state of the power MOSFET. However, under transient conditions such as avalanche operation of the power MOSFET, reverse recovering of the body diode and fast rising of drain-to-source voltage, current will flow through the p-body to the source electrode. This will cause a potential drop across the resistance of the p-body. If the current flow is large enough and the potential drop is significantly high enough, the n+-source/p-body junction will be forward biased, and the parasitic bipolar junction transistor will be activated. The activation of the parasitic bipolar junction transistor will cause a second-breakdown behavior of the power MOSFET, and thermal runaway can also result.

The above-described deficiencies of conventional field effect transistors are merely intended to provide an overview of some of problems of current technology, and are not intended to be exhaustive. Other problems with the state of the art, and corresponding benefits of some of the various non-limiting embodiments described herein, may become further apparent upon review of the following detailed description.

SUMMARY

The following presents a simplified summary to provide a basic understanding of some aspects described herein. This summary is not an extensive overview of the disclosed subject matter. It is not intended to identify key or critical elements of the disclosed subject matter, or delineate the scope of the subject disclosure. Its sole purpose is to present some concepts of the disclosed subject matter in a simplified form as a prelude to the more detailed description presented later.

To correct for the above noted deficiencies of conventional field effect transistors, provided are field effect transistors, and methods for manufacturing field effect transistors, with heavily doped body (p+-body) and normal threshold voltage. In an aspect, provided is a power semiconductor field effect transistor structure comprising a doped source of a first conductivity type, a doped body of a second conductivity type, a source electrode short-connecting the doped body and the doped source, a doped drift region of the first conductivity type, a first layer of a gate dielectric region covering the surface of the doped body and forming channel from the doped source to the doped drift region, a second layer of the gate dielectric region on top of the first layer, a third layer of the gate dielectric region on top of the second layer, and a gate electrode on top of the third layer. In an aspect, the doped source and the doped body are formed by high dose ion-implantation and annealing. Further, in an aspect, the doped body forms direct contact to the source electrode, and the second layer of the gate dielectric is a charge trapping material.

In another embodiment, provided is a method for fabricating a power semiconductor field effect transistor structure comprising: forming a doped drift region of a first conductivity type, forming a gate stack over the doped drift region, including, forming a first gate dielectric layer, forming a second gate dielectric layer on top of the first gate dielectric layer, forming a third gate dielectric layer on top of the second gate dielectric layer, depositing a gate electrode on the third gate dielectric layer, and patterning the gate electrode and the gate dielectric layers, forming a doped body of a second conductivity type in the doped drift region, forming a doped source of the first conductivity type in the doped body, wherein the first gate dielectric layer covers a surface of the body and forms a channel from the doped source to the doped drift region, forming a contact hole adjacent to the gate stack, and forming a source electrode above the doped source and the doped body, wherein source electrode short connects the doped body and the doped source. In an aspect, the forming the doped source includes forming the doped source by high dose ion-implantation and annealing, and the forming the doped body includes forming the doped body by high dose ion-implantation and annealing. In addition, in an aspect, the second gate dielectric layer is a charge trapping material.

The following description and the annexed drawings set forth in detail certain illustrative aspects of the disclosed subject matter. These aspects are indicative, however, of but a few of the various ways in which the principles of the various embodiments may be employed. The disclosed subject matter is intended to include all such aspects and their equivalents. Other advantages and distinctive features of the disclosed subject matter will become apparent from the following detailed description of the various embodiments when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Various aspects or features of this disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, materials, etc. In other instances, well-known structures and devices are shown in block diagram form to facilitate describing the subject disclosure.

By way of introduction, the subject matter disclosed herein relates to a power field effect transistor (FET) with a heavily doped (between $1\times10^{18}$ cm$^{-3}$ and $1\times10^{20}$ cm$^{-3}$) body (p+-body) and a normal threshold voltage. Embodiments of the subject application thus provide a FET with a heavily doped body (p+-body) and a charge trapping material in the gate dielectric. In order to avoid activation of the parasitic bipolar junction transistor, as discussed in the background, in various embodiments, the resistance of the p-body is reduced by heavy doping. However, the doping concentration of the p-body also determines the threshold voltage of the device. As a result, when the p-body is heavily doped, the power MOSFET may have too high of a threshold voltage, and thus various embodiments described herein address these and other issues.

With the subject embodiments of a FET, the base resistance of the parasitic bipolar junction transistor (BJT) is significantly reduced because of the high doping concentration (between $1\times10^{18}$ cm$^{-3}$ and $1\times10^{20}$ cm$^{-3}$) of the p+-body. The high doping concentration of the p+-body also causes a positive shift of the threshold voltage of the power FET. However, the positive shift of the threshold voltage is compensated by the positive fixed charges created in the charge trapping material of the gate dielectric. As a result of the compensation, the threshold voltage of the FET device is kept at a normal value The normal value is typically between 1 V and 3 V for devices with a breakdown voltage below 100 V, and between 2 V and 4 V for devices with a breakdown voltage above 100 V. Moreover, the p+-body can form ohmic contact directly with the source electrode. The fabrication process of the subject FET is thus simplified in comparison to conventional FET's which require a p+ region for connection to the source electrode.

The various embodiments of the subject FET improve ruggedness due to the suppression of the activation of the parasitic bipolar junction transistor under transient conditions. Moreover, the threshold voltage of the subject FET device can be programmed to a target value by controlling the amount of trapped positive fixed charges. The characteristic of programmable threshold voltage can be applied to insulated-gate bipolar transistors (IGBTs) to be used in power module applications. In an IGBT module, different IGBTs are connected in parallel. In order to obtain a uniform current distribution in the module at the on-state, the threshold voltage of different IGBTs should be kept the same. However, this goal can be challenging due to process variations. With the subject FETs, the threshold voltage of different IGBTs can be programmed to have the same value. Accordingly, the subject FETs can include IGBTs with an electrically programmable threshold voltage.

The subject FETs will now be described with reference to the drawings. Although the subject FETs are illustrated as an n-channel power metal-oxide-semiconductor field effect transistor (MOSFET), it is noted that the disclosure is equally applicable to p-channel power MOSFETs and other power field effect transistors such as an IGBT.

Figure 1:
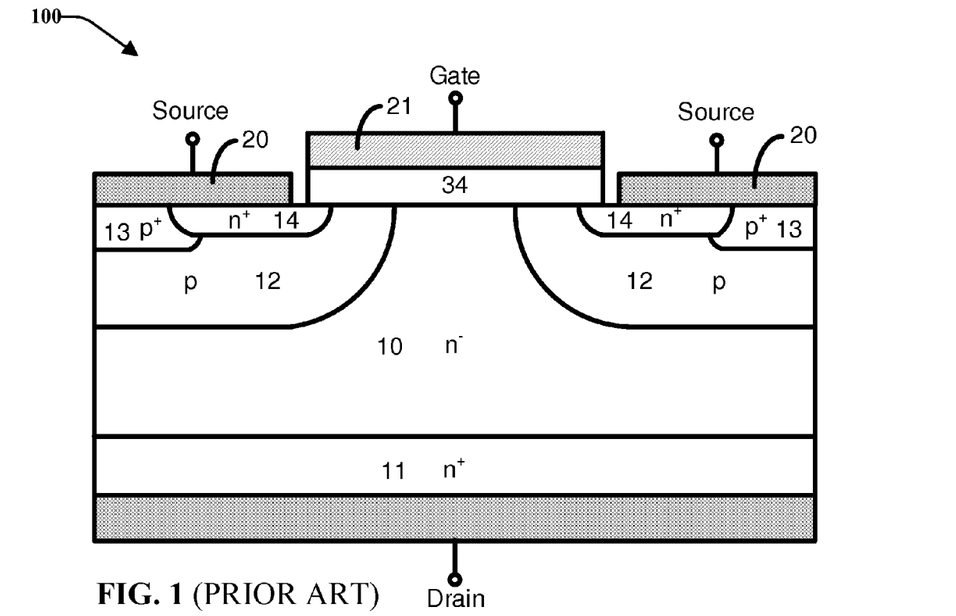
FIG. 1 presents a cross-sectional view of a prior art structure of a commonly used power metal-oxide-semiconductor field effect transistor (MOSFET).

With reference initially to FIG. 1, presented is a prior art structure of a conventional power MOSFET 100. Device 100 comprises a doped n$^-$ drift region 10 on an n$^+$ substrate 11. Device 100 further includes a gate dielectric layer 34 above the n$^-$ drift region 10 and a gate 21 above the gate dielectric. The gate dielectric 34 is a single layer of insulator, typically silicon oxide. Device 100 further comprises a p-body 12 below the gate 21 and a source electrode 20. The p-body 12 is generally formed by ion-implantation and annealing. The typical peak doping concentration of the p-body 12 of the commonly used power MOSFET is from $1\times10^{16}$ cm$^{-3}$ to $1\times10^{18}$ cm$^{-3}$. The p-body 12 is connected to the source electrode 20 through the heavily doped p$^+$ region 13. Device 100 further comprises an n$^+$ source 14 that is surrounded by the p-body 12. The parasitic NPN bipolar junction transistor (BJT) in the power MOSFET device 100 is composed of the n+ source 14, the p-body 12 and the n$^-$ drift region 10, and these three regions also act as the emitter, base and collector of the parasitic bipolar junction transistor, respectively. The p-body is connected to the source electrode through the p+ region 13, and the n+ source/p-body junction is shorted at the source electrode 20 of the device 100.

The n+-source/p-body junction of device 100 will not be forward biased at the static on-state or off-state. However, under transient conditions such as avalanche operation of the power MOSFET device 100, reverse recovering of the body diode and fast rising of drain-to-source voltage, current will flow through the p-body 12 to the source electrode 20. This will cause a potential drop across the resistance of the p-body 12. If the current flow is large enough and the potential drop is significantly high enough, the n+-source/p-body junction will be forward biased, and the parasitic bipolar junction transistor will be activated. The activation of the parasitic bipolar junction transistor will cause a second-breakdown behavior of the power MOSFET device 100, as well as thermal runaway.

Figure 2:
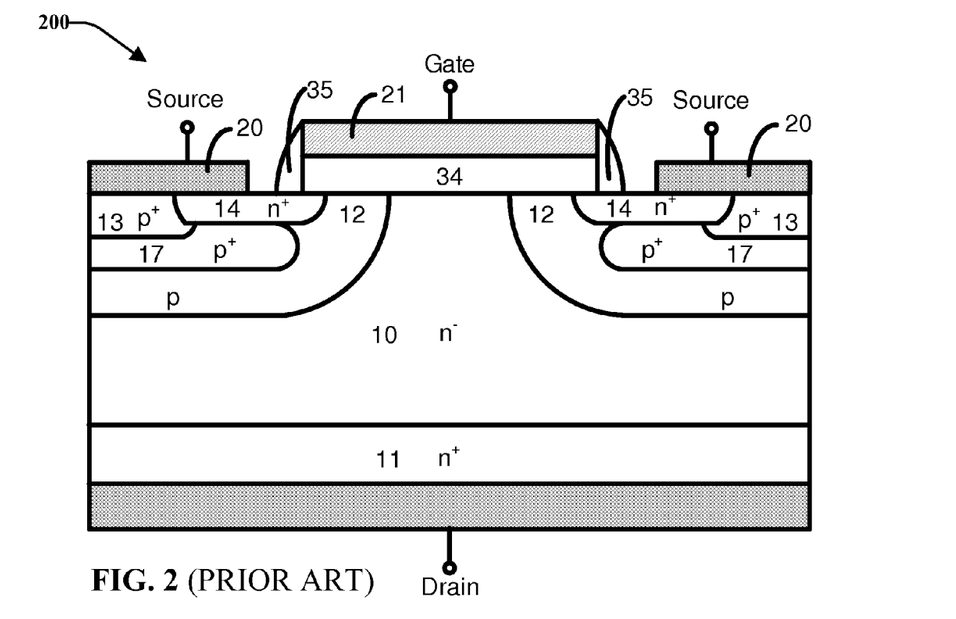
FIG. 2 presents a cross-sectional view of prior art structure of a power n-channel power MOSFET with an optimized doping profile of the p-body.

FIG. 2 presents another prior art structure of a power MOSFET device 200 with similar features 11, 10, 34, 21, 12, 13, and 20 and with an improved, e.g., optimized, doping profile of the p-body 12. In device 200, silicon oxide spacers 35 and the poly-silicon gate 21 were used as a self-aligning mask for high dose (between $1\times10^{14}$/cm$^2$ and $1\times10^{16}$/cm$^2$ boron ion-implantation. As a result, the p-body 12 is heavily doped at the region 17 under the n+ source 14. However, the doping concentration of p-body region 12 which is close to the channel is the same as that of device 100 in FIG. 1. The doping optimization of the p-body 12 of device 200 results in heavily doping of the part of the p-body 12 which is farther away from the channel. However, the p-body region which is close to the channel still has low doping, otherwise, the threshold voltage of the device 200 would be affected. Because of this limitation, the part of the p-body which is closed to the channel is not heavily doped, leaving that part of the parasitic bipolar junction transistor still susceptible to turn-on during the transient conditions.

Figure 3:
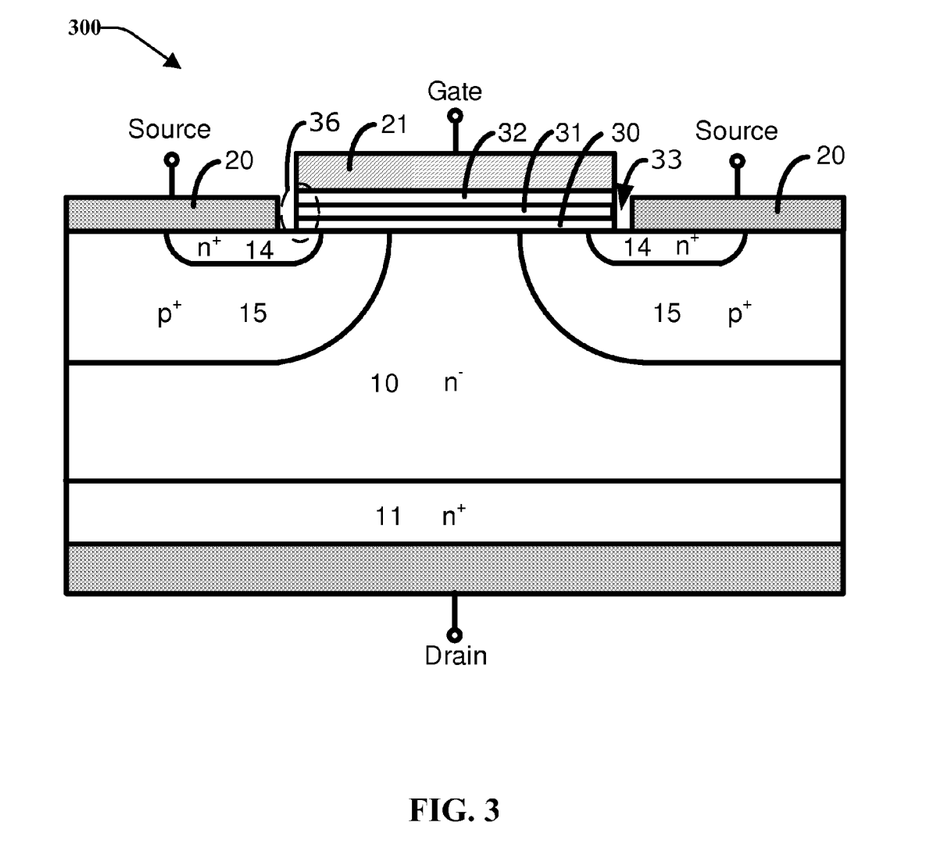
FIG. 3 presents a cross-sectional view of a field effect transistor embodied as a power MOSFET in accordance with an embodiment.

Turning now to FIG. 3, presented is a cross-section of an FET 300 embodied in a power MOSFET in accordance with an embodiment of the subject disclosure. Device 300 comprises a doped source of a first conductivity type (n$^+$ source 14), a doped body of a second conductivity type (p$^+$ body 15), a source electrode short-connecting the body and the source, and a doped drift region (n$^-$ drift region 10) of the first conductivity type. In an aspect, the doped source is an n$^+$ source 14 and is heavily doped, the doped body is a p$^+$ body 15 and is heavily doped, and the doped drift region is an n$^-$ drift region 10 and is lightly doped. For example, in a dose of the ion-implantation for the p$^+$ body 15 is from $1\times10^{14}$/cm$^2$ to $1\times10^{16}$/cm$^2$ with a peak doping concentration of the p+ body 15 from $1\times10^{18}$ cm$^{-3}$ to $1\times10^{20}$ cm$^{-3}$. In another example, the dose of the ion-implantation for the n+-source 14 can be from about $1\times10^{14}$/cm$^2$ to $1\times10^{16}$/cm$^2$. The doping concentration for the n$^-$ drift region 10 depends on the voltage rating of the power MOSFET. Still in yet another example, the doping concentration for the n$^-$ drift region 10 is between $1\times10^{14}$ cm$^{-3}$ and $1\times10^{17}$ cm$^{-3}$. As seen in FIG. 3, the n$^-$ drift region 10 is located adjacent to and below the p$^+$ body 15, and the n$^+$ source 14 is located within the upper surface of the p$^+$ body 15. In particular, the n$^+$ source 14 is located adjacent to a bottom surface of the source electrode 20, adjacent to a bottom surface of contact hole 33 which separates the source electrode 20 from the gate stack and is adjacent to the gate stack, and adjacent to a bottom surface of the gate dielectric region 36.

Device 300 further includes a gate dielectric region 36 above the n$^-$ drift region 10 and a gate 21 above the gate dielectric region 36. Gate dielectric region 36 comprises of a charge trapping material 31 embedded in the gate dielectric of the power MOSFET device 300. In an aspect, gate dielectric region 36 comprises multiple layers. In an aspect, a first layer 30 of the gate dielectric region 36 is positioned above a surface of the n+ source 14, the p$^+$ body 15 and the n$^-$ drift region 10. For example, the first layer of a gate dielectric region 36 can cover the surface of the p$^+$ body 15 and the surface of the n$^-$ drift region 10, and form a channel from the source 14 to the drift region 10. In an aspect, the first layer 30 comprises silicon oxide. The first layer may have a thickness from about 0.2 nm to about 20 nm. In another aspect, the first layer 30 may have a thickness from about 0.5 nm to about 15 nm. Still in yet another aspect, the first layer 30 may have a thickness from about 1 nm to 10 nm.

The second layer 31 of the gate dielectric region 36 includes a charge trapping material 31. In an aspect, the charge trapping material 31 includes at least one of silicon nitride, silicon nanocrystal, or a combination of both silicon nitride and silicon nanocrystal. However, it should be appreciated that any type of charge trapping material can be employed. The second layer 31 enables an amount of fixed charge to be located therein. Further, since the amount of the fixed charge can be exactly controlled, the threshold voltage of the device is electrically programmable. In an aspect, the thickness of the charge trapping material 31 is from about 0.2 to about 200 nm. In another aspect, the thickness of the charge trapping material is from about 0.5 nm to about 150 nm. In yet another aspect, the thickness of the charge trapping material is from 1 nm to 100 nm. Still in yet another aspect, the thickness of the charge trapping material is from about 10 nm to about 50 nm.

The third layer 32 of the gate dielectric region 36 can include at least one of silicon oxide or aluminum oxide. In an aspect, the thickness of the third layer 32 of the gate dielectric is from about 1 nm to about 250 nm. In yet another aspect, the thickness of the third layer is from about 5 nm to about 225 nm. In yet another aspect, the thickness of the third layer is from about 10 nm to about 200 nm. Still, in yet another aspect, the thickness of the third layer is from about 50 nm to about 150 nm.

In an embodiment, the peak doping concentration of the p$^+$-body 15 is from is greater than $1\times10^{18}$ cm$^{-3}$ and from about $1\times10^{18}$ cm$^{-3}$ to $1\times10^{20}$ cm$^{-3}$. The p$^+$-body 15 is directly connected to the source electrode 20. In an aspect, the source electrode 20 is aluminum. In another aspect, the source electrode can comprise of any metal, including but not limited to tungsten, copper, titanium nitride, titanium silicide, cobalt silicide and nickel silicide. A thickness of the source electrode 20 may be from about 0.1 μm to about 20 μm. In an embodiment, the gate electrode 21 is at least one of poly-silicon, metal or metal silicide. In an aspect, the thickness of the gate electrode 21 is from about 10 nm to about 2000 nm.

FIGS. 4-11 present the fabrication process of an FET device (such as device 300) embodied in a power MOSFET in accordance with an embodiment of the subject disclosure. As mentioned supra, in a conventional power MOSFETs, the doping concentration of the p-body is limited by the threshold voltage requirement. To increase the p-body doping can reduce the base resistance, but it can result in too high of the threshold voltage. The following fabrication process presents a simplified process for creating a power FET with an optimized doping profile for suppressing the activation of the parasitic BJT and for creating a power FET with a programmable $V_{TH}$.

Figure 4:
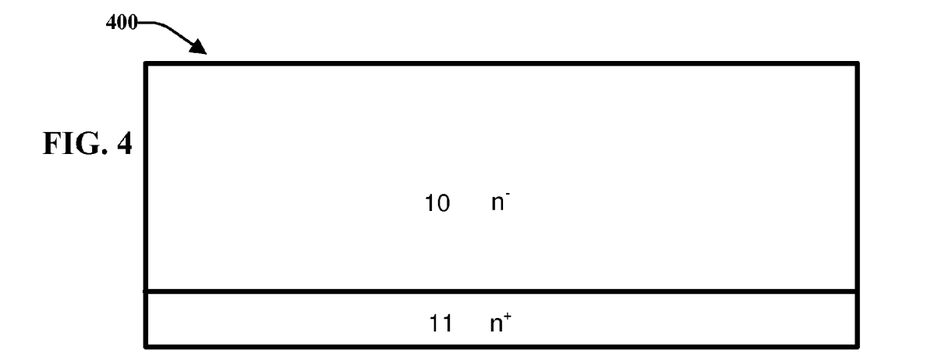
FIG. 4 presents a cross-sectional view of the formation of the drift region accordance with an embodiment.

With reference to FIG. 4, depicted is a device 400 with formation of a lightly doped (between $1\times10^{14}$ cm$^{-3}$ to $1\times10^{17}$ cm$^{-3}$) n$^-$ drift region 10 on an n+ substrate 11. In an aspect, the n$^-$ drift region 10 is formed by epitaxial growth on the n+ substrate 11. For example, the process of forming a power FET in accordance with the subject disclosure can begin with growing the n⁻ drift region 10 (an N epitaxial layer) with a resistivity ranging from 0.10 to 10 ohm-cm on top of an n+ substrate 11. In an aspect, the substrate has a resistivity of 0.001 to 0.010 ohm-cm. In an embodiment, the thickness and the resistivity of the n⁻ epitaxial layer 10 can depend on the device requirements for the on-resistance and breakdown voltage. In an embodiment, the thickness of the n⁻ epitaxial layer 10 is about two to six microns.

Figure 5:
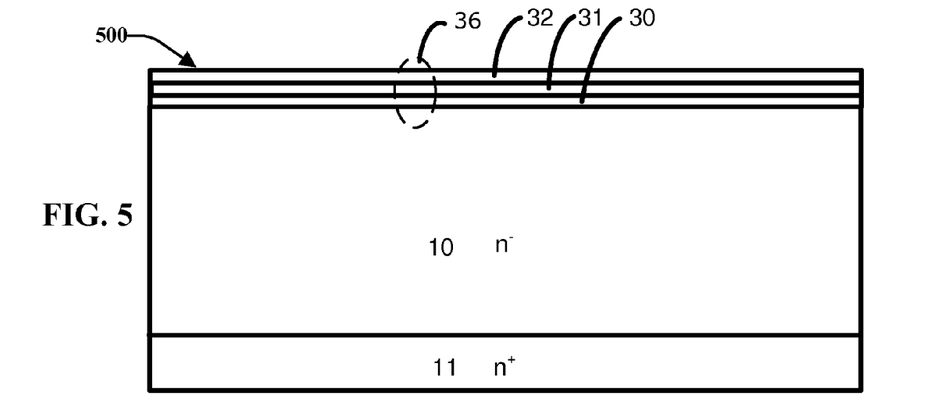
FIG. 5 presents a cross-sectional view of the formation of the charge trapping layers in accordance with an embodiment.

FIG. 5 shows a device 500 with the formation of the gate dielectric region 36 layers. According to an aspect, the first layer 30 of the gate dielectric region 36 is silicon oxide and having a thickness from about 1 nm to about 10 nm. In an aspect, the first layer 30 of the gate dielectric region 36 is formed by dry oxidation of the silicon surface. For example, forming the first gate dielectric layer 30 can comprise of oxidizing the surface, via dry oxidation, of the n⁻ drift region 10. According to another aspect, the first layer 30 of the gate dielectric region 36 comprises of native oxide on the silicon surface of the n⁻ drift region 10.

The second layer 31 of the gate dielectric region 36 is formed over of the first layer 30 of the gate dielectric region 36. The second layer 31 of the gate dielectric region 36 comprises a charge trapping material 31. In an aspect, the typical thickness of the charge trapping material 31 is from about 1 nm to about 100 nm. In an aspect, the charge trapping material 31 is silicon nitride which is formed by chemical vapor deposition. For example, forming the second gate dielectric layer 31 can include depositing silicon nitride on the first get dielectric layer 30. According to another aspect, the charge trapping material 31 is silicon nanocrystal which is formed by chemical vapor deposition. For example, forming the second gate dielectric layer 31 can include depositing silicon nanocrystal on top of the first gate dielectric layer 30. According to another aspect, the charge trapping material 31 is a combination of silicon nitride and silicon nanocrystal, where both of these materials are formed by chemical vapor deposition. Still in yet another aspect, the charge trapping material 31 is silicon nanocrystal which is formed by silicon ion-implantation after the formation of the third layer 32 of the gate dielectric. According to a further aspect, the charge trapping material 31 is a combination of silicon nitride formed by chemical vapor deposition and silicon nanocrystal formed by ion-implantation.

The third layer 32 of the gate dielectric region 36 is formed over of the charge trapping material 31. According to an aspect, the third layer 32 of the gate dielectric region 36 is silicon oxide which is formed by oxidizing the charge trapping material 31. For example, forming the third gate dielectric layer 32 can comprise of oxidizing the second gate dielectric material 31. In another aspect, the third layer 32 of the gate dielectric region 36 is silicon oxide which is formed by chemical vapor deposition. For example, forming the third gate dielectric layer 32 can comprise of depositing silicon oxide over the second gate dielectric layer 31. In yet another aspect, the third layer 32 of the gate dielectric region is aluminum oxide which is formed by atomic layer deposition. In an embodiment, the thickness of the third layer 32 of the gate dielectric region 36 is from about 10 nm to about 200 nm.

Figure 6:
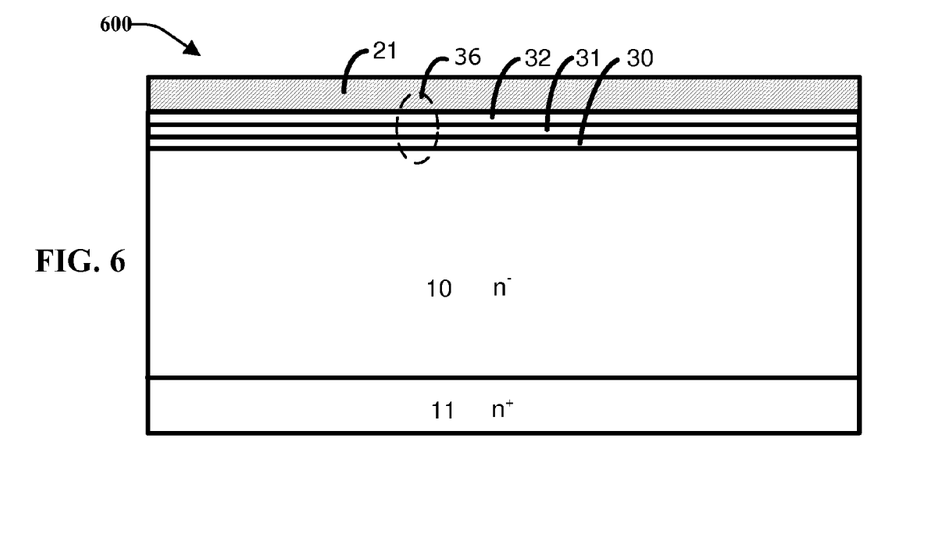
FIG. 6 presents a cross-sectional view of the formation of the gate electrode accordance with an embodiment.

FIG. 6 shows a device 600 with the formation of poly-silicon of the gate electrode 21. In an aspect, the poly-silicon 21 is formed by chemical vapor deposition. For example, a poly-silicon layer 21 can be deposited over the third gate electrode layer 32. In an aspect, the thickness of the poly-silicon of the gate electrode 21 is from 10 nm to 2000 nm. According to another aspect the poly-silicon of the gate electrode 21 can be transferred to metal or metal silicide after the formation of the p⁺ body 15 and n⁺ source 14. For example,
after the formation of the as shown in FIGS. 9 and 8, the poly-silicon gate electrode can be silicided after the formation of the p⁺ body 15 and n⁺ source 14.

Figure 7:
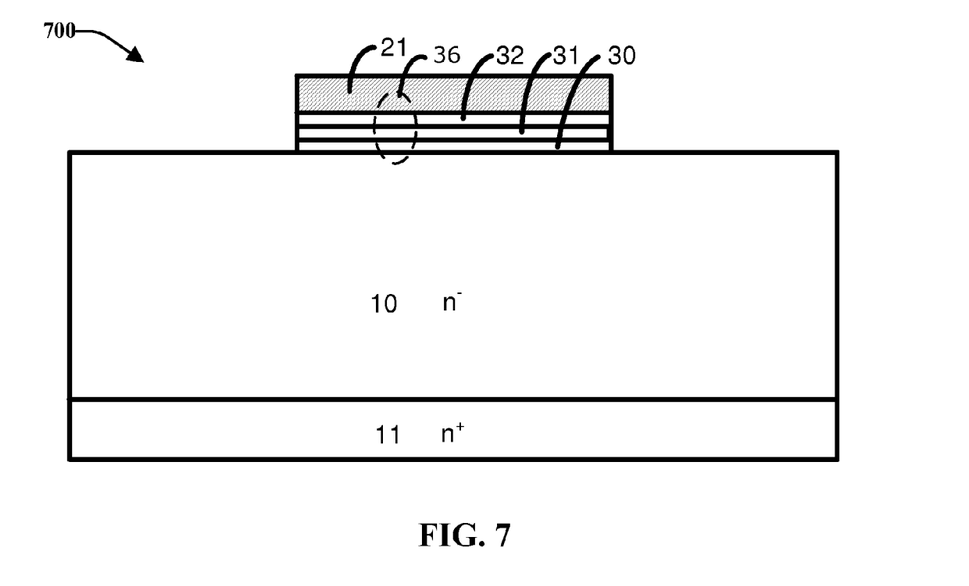
FIG. 7 presents a cross-sectional view of the formation of the gate stack in accordance with an embodiment.

FIG. 7 shows the formation of the gate stack of a device 700. According to an embodiment, the poly-silicon of the gate electrode 21 and the gate dielectric region 36 comprising of layers 30, 31 and 32, are patterned by anisotropic etching to form a gate stack. The gate stack is formed such that it is centered over the upper surface of the n⁻ drift region 10 and over a portion of a surface of the p⁺ body 15 adjacent to the n⁻ drift region 10. In an aspect, the etching can include reactive ion etching.

Figure 8:
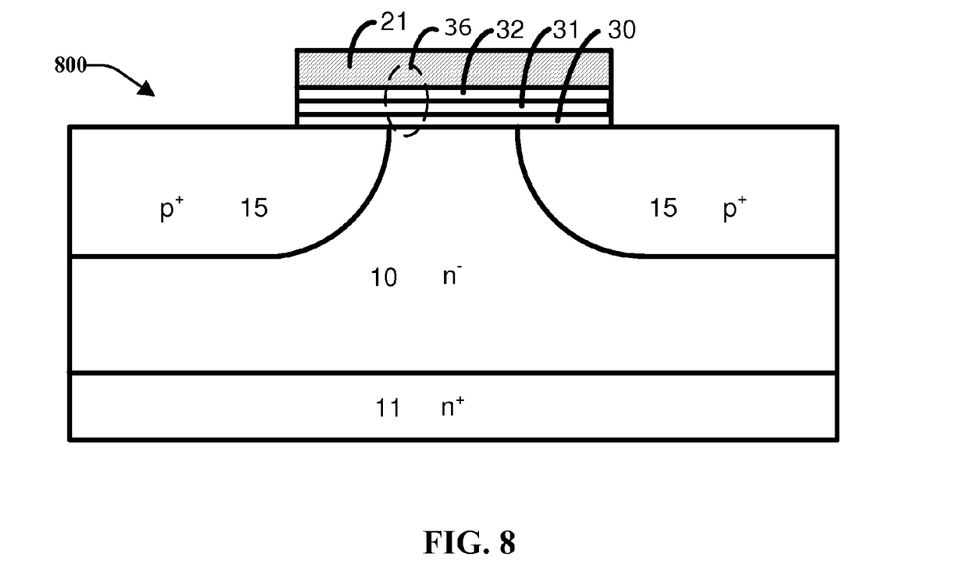
FIG. 8 presents a cross-sectional view of the formation of the doped body in accordance with an embodiment.

FIG. 8 shows the formation of the p⁺ body 15 of device 800. According to an aspect, the p+ body 15 is formed by high dose ion-implantation and annealing. In an aspect, the dose of the ion-implantation is from $1\times10^{14}/cm^2$ to $1\times10^{16}/cm^2$. In an aspect, the annealing is carried out at a temperature between 800 degree C. and 1200 degree C. for a duration between 1 second and 10 hours, such that the p+ body 15 reaches a depth between 0.3 µm and 3 µm. A peak doping concentration of the p+ body 15 can be from $1\times10^{18}$ cm$^{-3}$ to $1\times10^{20}$ cm$^{-3}$. The p+ body 15 comprises of a region of an upper surface of the n⁻ drift region 10 and located under a portion of the gate stack.

Figure 9:
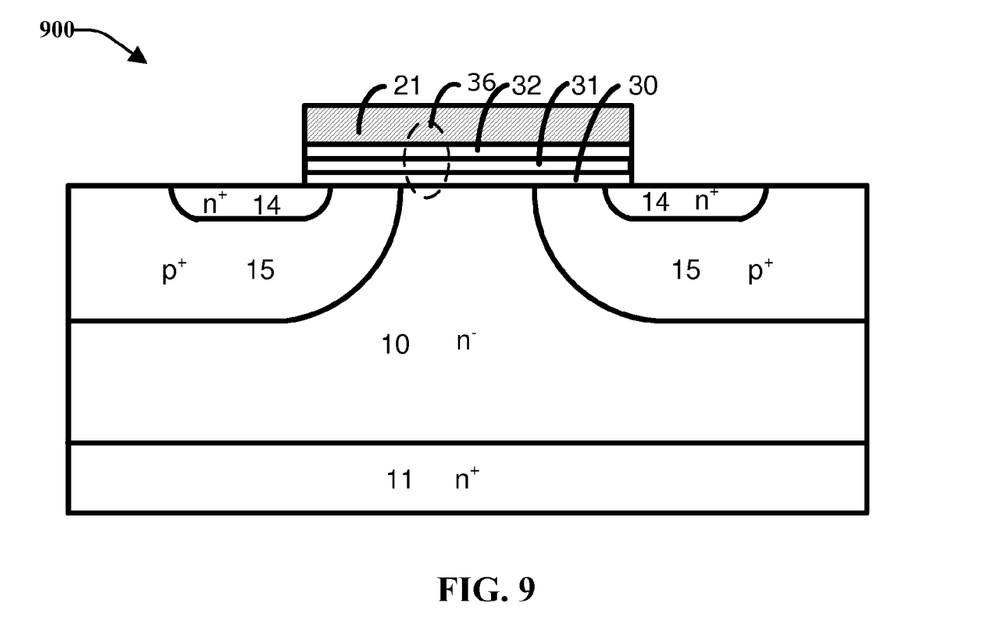
FIG. 9 presents a cross-sectional view of the formation of the doped source in accordance with an embodiment.

FIG. 9 shows the formation of an n⁺ source 14 of device 900. In an aspect, the n+ source 14 is formed by high dose ion-implantation and annealing. The dose of the ion-implantation for the n+-source 14 can be from about $1\times10^{14}/cm^2$ to $1\times10^{16}/cm^2$. n+-source 14 comprises of a region of an upper surface of p+ body 15 and located under a portion of the gate stack. In an aspect, annealing is carried out at a temperature between 800 degree C. and 1100 degree C. for a duration between 1 second and 100 minutes, such that the n+-source 14 reaches a depth between 0.01 µm and 0.5 µm.

Figure 10:
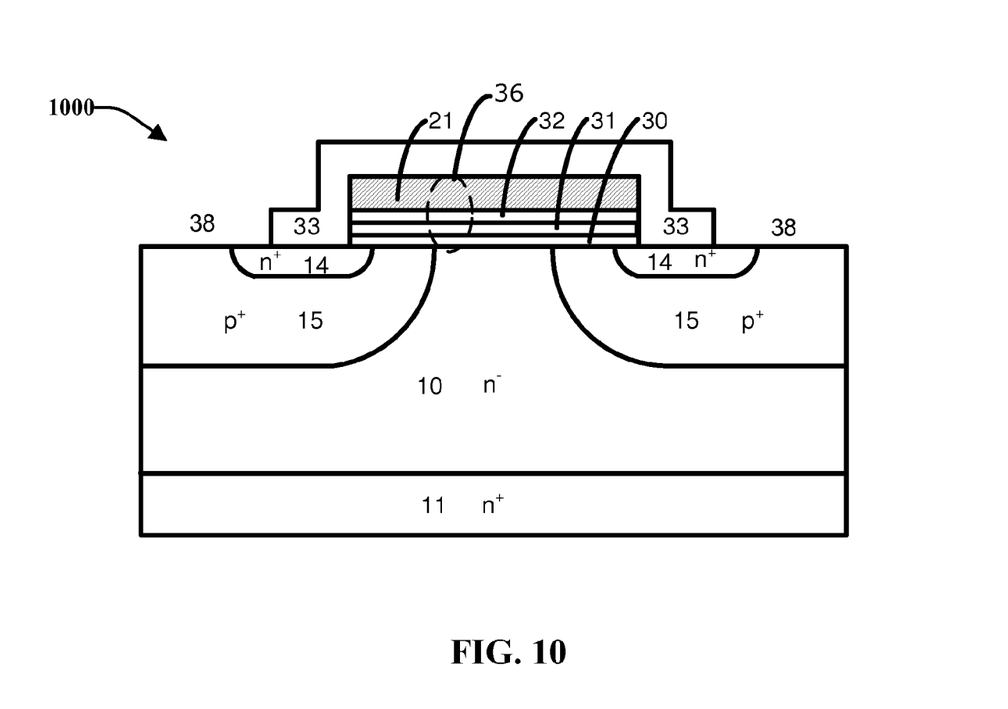
FIG. 10 presents a cross-sectional view of the formation of the contact hole in accordance with an embodiment.

FIG. 10 shows the formation of a contact hole 38 in device 1000. According to an embodiment, the contact hole 38 is formed by silicon oxide 33 deposition and patterning. For example, a silicon oxide layer 33 can be deposited over the gate stack. In an aspect, a thickness of the deposited silicon oxide 33 is from about 100 nm to about 1000 nm. Then, the silicon oxide layer 33 can be patterned via etching, such as reactive ion etching, in order to form contact holes 38. After this, the source electrode 20 is formed by filling the contact holes 38 as shown in FIG. 11.

Figure 11:
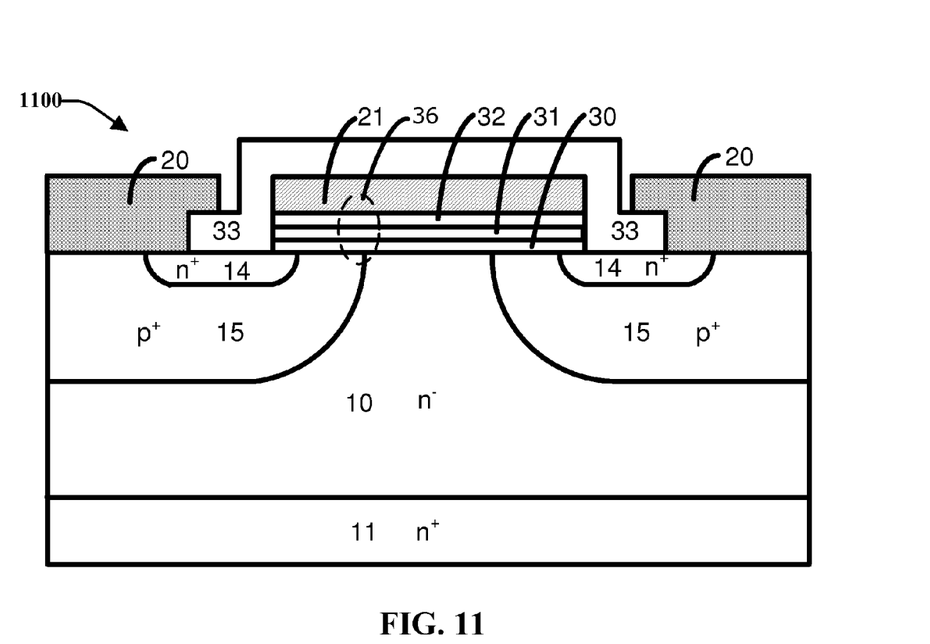
FIG. 11 presents a cross-sectional view of the formation of the source electrode in accordance with an embodiment.

FIG. 11 shows the formation of a source electrode 20 of device 1100. In an aspect, the source electrode 20 is formed by aluminum deposition and patterning. For example, aluminum can be formed over a surface of the p+ body 15, the n+-source 14, and a portion of the silicon oxide layer 33. In an aspect, the thickness of the deposited aluminum 20 may be from about 0.1 µm to 20 µm. Then, the aluminum layer can be patterned via etching, such as reactive ion etching to form device 300, pictured in FIG. 3.

It should be appreciated that the fabrication steps of the subject FET device embodied in an IGBT is the same as that for a subject FET device embodied in a power MOSFET except the formation of the n⁻ drift region 10. For the power MOSFET, the n⁻ drift region 10 is formed by epitaxial growth on the n⁺ substrate 11. However, for the IGBT device, the n⁻ drift region 10 is formed by epitaxial growth on the p+ substrate 16 or thinning down of an n⁻ doped substrate wafer.

Figure 12:
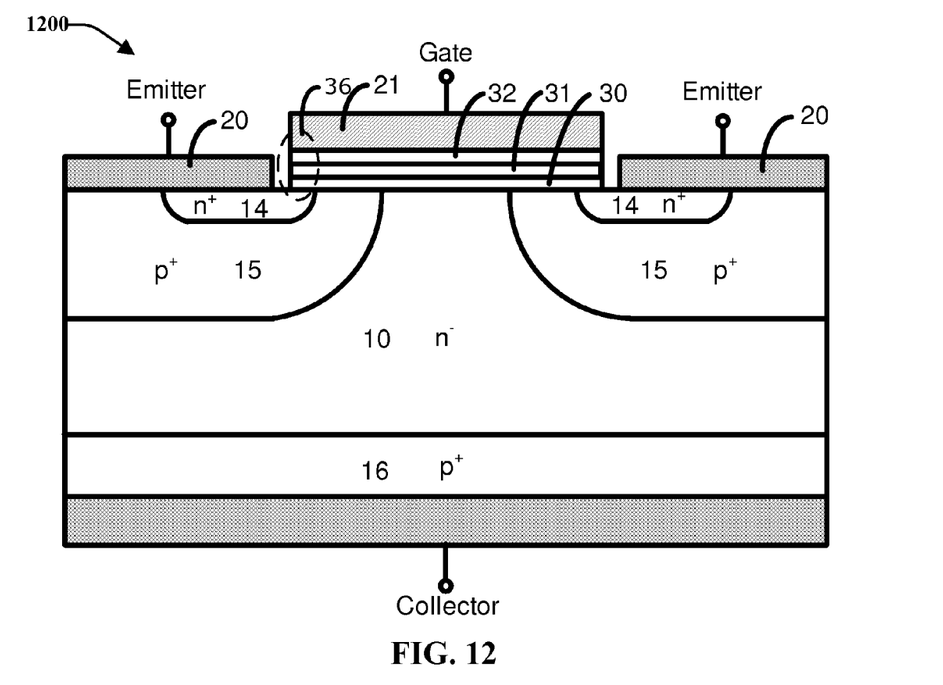
FIG. 12 presents a cross-sectional view of an insulated-gate bipolar transistor (IGBT) in accordance with an embodiment.

FIG. 12 presents a cross-section of an FET device 1200 embodied in an IGBT in accordance with an embodiment of the subject disclosure. The device 1200 structure is similar to the power MOSFET device 300 structure shown in FIG. 3. However, with device 1200, the substrate of the IGBT is a p+ substrate 16. The p+ base (i.e. p+ body) 15 of device 1200 is heavily doped, and charge trapping material 31 is embedded in the gate dielectric region 36 of the IGBT device 1200. The doping concentration for the n⁻ drift region 10 depends on the voltage rating of the IGBT. Still in yet another example, the doping concentration for the n⁻ drift region 10 is between $1\times10^{12}$ cm$^{-3}$ and $1\times10^{15}$ cm$^{-3}$. In an aspect, the first layer 30 of the gate dielectric region 36 is silicon oxide, and having a thickness from about 1 nm to about 10 nm. The second layer 31 of the gate dielectric region 36 comprises a charge trapping material 31. In an aspect, the charge trapping material 31 is at least one of silicon nitride, silicon nanocrystal or a combination of both materials. Further, in an aspect, a thickness of the charge trapping material 31 is from about 1 nm to about 100 nm.

Further, in an aspect, the third layer 32 of the gate dielectric region 36 is silicon oxide or aluminum oxide. A thickness of the third layer 32 of the gate dielectric region is may be from about 10 nm to 200 nm. In an embodiment, the peak doping concentration of the p+ base (i.e. p+ body) 15 is from $1\times10^{18}$ cm$^{-3}$ to $1\times10^{20}$ cm$^{-3}$. The p+ base (i.e. p+ body) 15 is directly connected to the metal of the emitter (source) electrode 20. In an aspect, the metal of the emitter (source) electrode (20) is aluminum. A thickness of the aluminum 20 can be from about 0.1 μm to about 20 μm. The gate electrode 21 of the subject device 1200 can be poly-silicon, metal or metal silicide. In an aspect, a thickness of the poly-silicon of the gate electrode 21 is from about 10 nm to about 2000 nm.

According to the present embodiments, planar power field effect transistors are shown from FIG. 3 to FIG. 12. However, it should be appreciated that the gate stack, including the charge trapping material 31 in the gate dielectric region 36 and heavily doped p⁺ body 15, can also be embodied in trench gate power field effect transistors.

Figure 13:
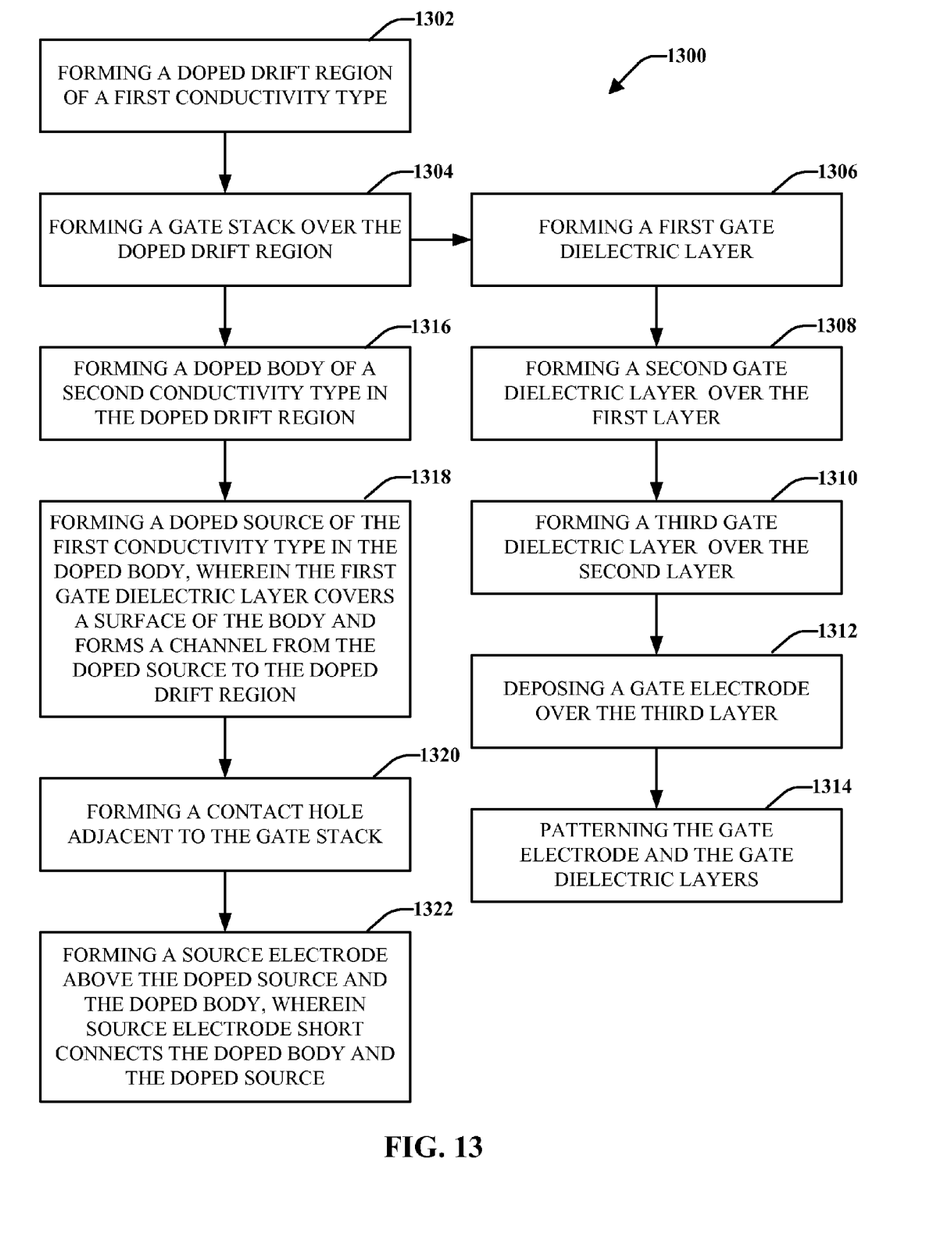
FIG. 13 presents a non-limiting flow diagram of a method for fabricating an FET in accordance with an embodiment.
Figure 14:
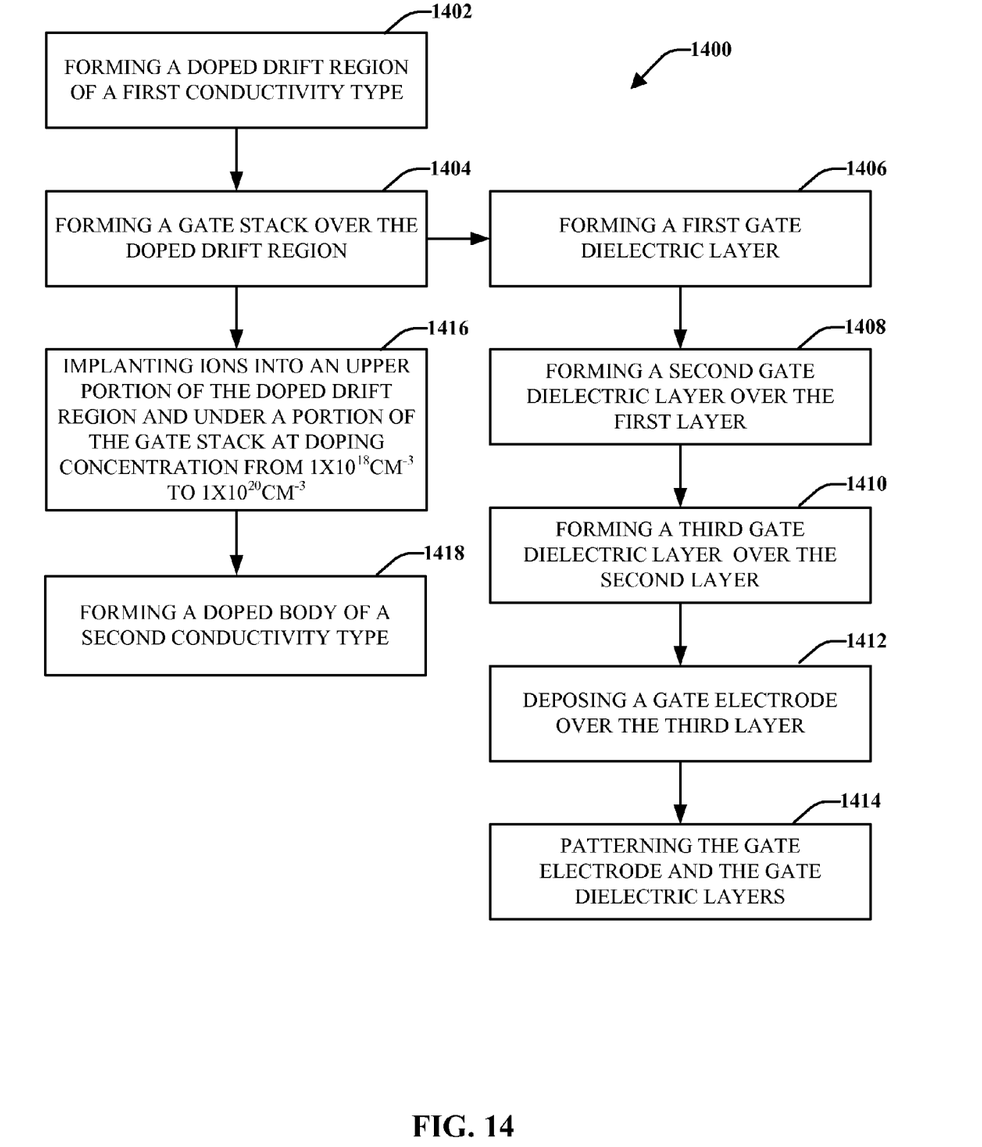
FIG. 14 presents a non-limiting flow diagram of a method for fabricating an FET in accordance with another embodiment.

FIGS. 13-14 illustrates methodologies in accordance with certain aspects of this disclosure. While, for purposes of simplicity of explanation, the methodologies are shown and described as a series of acts, it is to be understood and appreciated that this disclosure is not limited by the order of acts, as some acts may occur in different orders and/or concurrently with other acts from that shown and described herein. For example, those skilled in the art will understand and appreciate that methodologies can alternatively be represented as a series of interrelated states or events, such as in a state diagram. Moreover, not all illustrated acts may be required to implement methodologies in accordance with certain aspects of this disclosure. Additionally, it is to be further appreciated that the methodology disclosed herein after and throughout this disclosure is capable of being stored on an article of manufacture to facilitate transporting and transferring such methodologies to computers.

Turning now to FIG. 13, presented is a high level flow diagram of a process 1300 for fabricating an FET in accordance with an embodiment of the subject disclosure. At reference numeral 1302, a doped drift region of a first conductivity type is formed. In an aspect, the doped drift region is formed by epitaxial growth of an n⁻-drift region on an n⁺ substrate. At 1304, a gate stack is formed over the doped drift region. Forming the gate stack includes forming a first gate dielectric layer at 1306, forming a second gate dielectric layer over the first layer at 1308, forming a third gate dielectric layer over of the second gate dielectric layer at 1310, depositing a gate electrode over the third gate dielectric layer at 1312, and then patterning the gate electrode and the gate dielectric layers at 1314.

After the formation of the gate stack, at 1316, a doped body of a second conductivity type is formed in the doped drift region. In an aspect, the doped body is a p⁺ body formed by high dose ion-implantation and annealing. At 1318, a doped source of the first conductivity type is formed in the doped body, wherein the first gate dielectric layer covers a surface of the body and forms a channel from the doped source to the doped drift region. In an aspect, the doped source is an n⁺ source formed by high dose ion-implantation and annealing. Then, at 1320, a contact hole is formed adjacent to the gate stack. The contact hole can be formed by depositing a dielectric layer and patterning the dielectric layer. Further, at 1322, a source electrode is formed above the doped source and the doped body, wherein source electrode short connects the doped body and the doped source. In an aspect, the source electrode is formed by depositing a metal layer and patterning.

Turning now to FIG. 14, presented is a high level flow diagram of a process 1400 for fabricating a FET in accordance with an embodiment of the subject disclosure. At reference numeral 1402, a doped drift region of a first conductivity type is formed. In an aspect, the doped drift region is formed by epitaxial growth of an n⁻-drift region on an n⁺ substrate. At 1404, a gate stack is formed over the doped drift region. Forming the gate stack includes forming a first gate dielectric layer at 1406, forming a second gate dielectric layer over of the first layer at 1408, forming a third gate dielectric layer over of the second gate dielectric layer at 1410, depositing a gate electrode over the third gate dielectric layer at 1412, and then patterning the gate electrode and the gate dielectric layers at 1414. After the formation of the gate stack, at 1416, ions are implanted into an upper portion of the doped drift region and under a portion of the gate stack at doping concentration from $1\times10^{18}$ cm$^{-3}$ to $1\times10^{20}$ cm$^{-3}$ to form a doped body of a second conductivity type at 1418.

Figure 15:
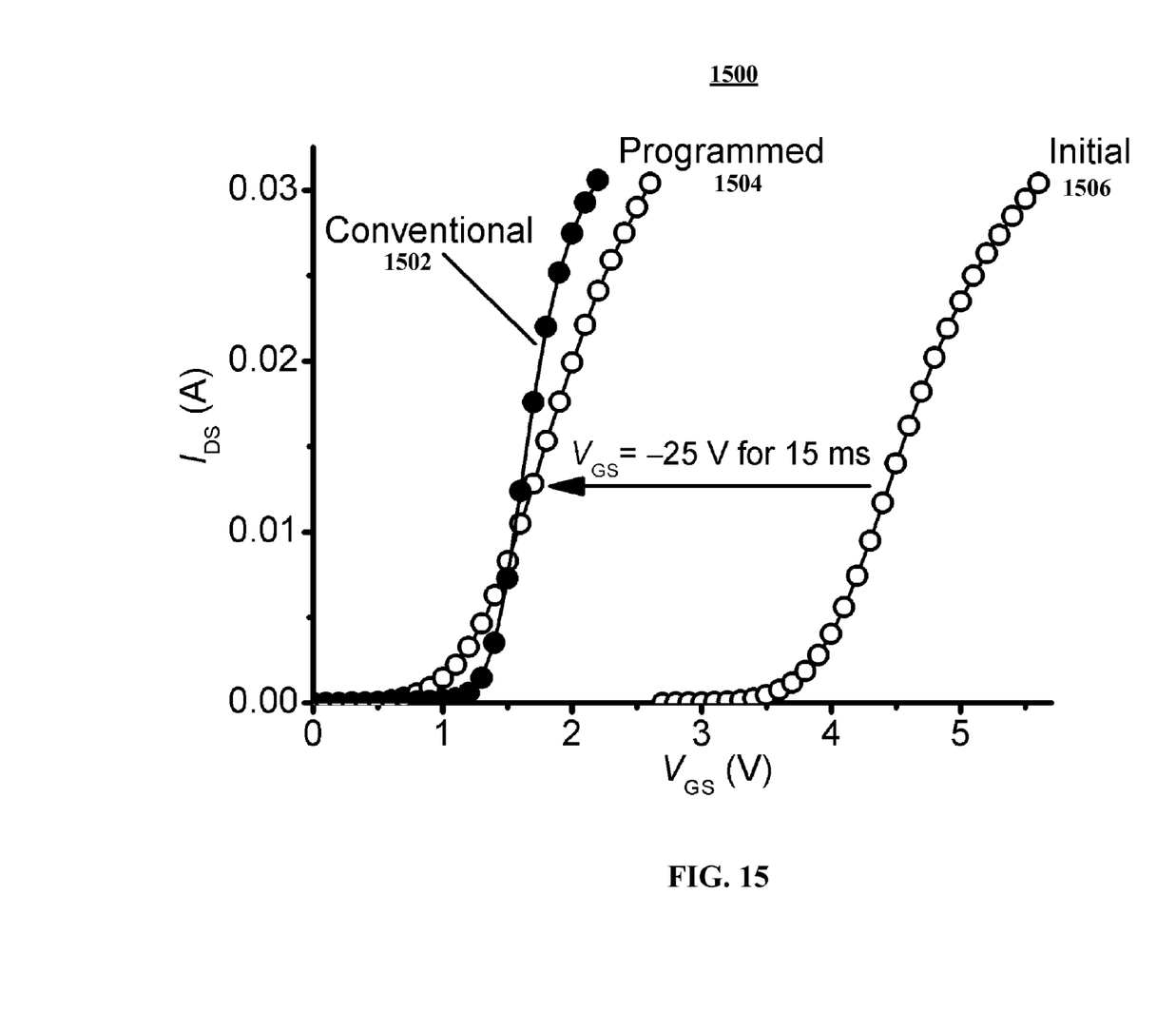
FIG. 15 presents a graph depicting the experimental transfer characteristics of a power MOSFET in accordance with an embodiment.

FIG. 15 presents a graph 1500 depicting an exemplary non-limiting set of sample results illustrating one or more aspects of the various embodiments described herein. The experimental transfer characteristics of a novel power MOSFET in accordance with an embodiment is shown in the figure. Using the techniques described herein, the doping concentration of the p-body is increased by an order of magnitude compared to that of the conventional power MOSFET, and the threshold voltage of the novel device was programmed to the same 1 V as that of the conventional device by applying −25 V to the gate of the device for 15 ms, as shown in the figure. Due to the heavily doped p-body 15, the parasitic BJT activation in the novel device is suppressed.

Figure 16:
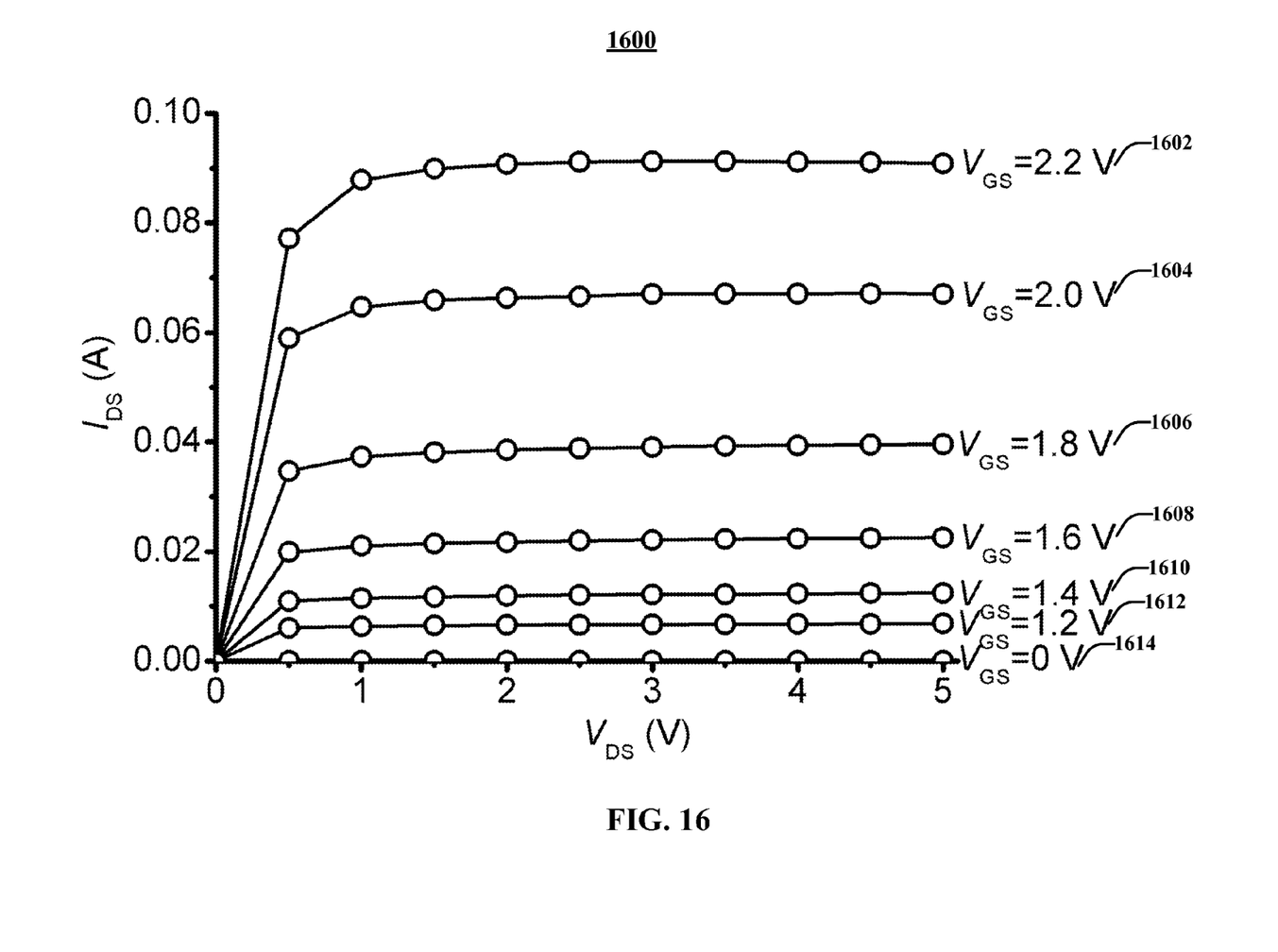
FIG. 16 presents a graph depicting the experimental $I_{DS}$-$V_{DS}$ characteristics of the power MOSFET with a programmed threshold voltage as shown previously in FIG. 15.

FIG. 16 presents a graph 1600 depicting the $I_{DS}$-$V_{DS}$ characteristics of the power MOSFET with a programmed threshold voltage of 1 V as shown previously in FIG. 15.

Unclamped inductive switching (UIS) measurement was used to evaluate the ruggedness of a subject device as characterized in FIG. 15 and FIG. 16. In the measurement, the device under test (DUT) was connected in series with an inductor (400 μH) along with a DC power supply (30 V) at room temperature. A single voltage pulse (0 V to 20 V) was applied to the gate of the DUT, and the width of the pulse was increased until the failure of the DUT was observed at high $I_{DS}$ and high $V_{DS}$. As a result, the avalanche energy absorption of the novel device at UIS is about 5.2 times that of the conventional power MOSFET. The above results have been published on IEEE Electron Device Letters.

The resultant power devices formed herein are useful in any electronic device. For example, the resultant power devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the power devices. Examples of hand-held devices include cell phones and other two way communication devices, personal data assistants, Palm Pilots, pagers, notebook computers, remote controls, recorders (video and audio), radios, small televisions and web viewers, cameras, and the like.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the term "includes" and "involves" are used in either the detailed description or the claims, such terms are intended to be inclusive in a manner similar to the term "comprising" as "comprising" is interpreted when employed as a transitional word in a claim.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

The word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

What is claimed is:

1. A vertical metal-oxide-semiconductor field effect transistor (MOSFET) structure, comprising:
    a gate stack formed on a top surface of a semiconductor substrate of a first conductivity type, the gate stack comprising a gate dielectric adjacent to the top surface of the semiconductor substrate and a gate electrode formed over the gate dielectric, wherein the gate dielectric comprises a charge trapping material;
    a drain electrode formed on a bottom surface of the semiconductor substrate;
    a doped source region of the first conductivity type formed within the semiconductor substrate adjacent to and below outer portions of a bottom surface of the gate dielectric;
    a doped body region of a second conductivity type formed within the semiconductor substrate around the doped source region, adjacent to and below inner portions of the bottom surface of the gate dielectric;
    a source electrode formed on the top surface of the semiconductor substrate, lateral to a side surface of the gate stack, and short-connecting the doped body region and the doped source region; and
    a doped drift region of the first conductivity type formed around the doped body region, adjacent to and below a center portion of the bottom surface of the gate dielectric, wherein a vertical channel is established within the vertical MOSFET structure extending from the doped source region through the doped drift region to the drain electrode.

2. The vertical MOSFET structure of claim 1, wherein the source electrode comprises a metal.

3. The vertical MOSFET structure of claim 1, wherein the doped body region forms direct contact with the source electrode.

4. The vertical MOSFET structure of claim 1, wherein the gate electrode comprises at least one of poly-silicon, metal or metal silicide.

5. The vertical MOSFET structure of claim 1, wherein the gate dielectric comprises three layers comprising a bottom layer formed adjacent to the top surface of the semiconductor substrate, a middle layer formed adjacent to and above the bottom layer and a top layer formed adjacent to and above the middle layer, wherein the bottom layer comprises silicon oxide.

6. The vertical MOSFET structure of claim 5, wherein the middle layer comprises the charge trapping material.

7. The vertical MOSFET structure of claim 6, wherein the middle layer comprises at least one of silicon nitride or silicon nanocrystal.

8. The vertical MOSFET structure of claim 5, wherein the top layer comprises silicon oxide.

9. The vertical MOSFET structure of claim 5, wherein the top layer comprises aluminum oxide.

10. The vertical MOSFET structure of claim 6, wherein the charge trapping material has a thickness from about 10 nm to about 50 nm.

11. The vertical MOSFET structure of claim 1, wherein the first conductivity type is an n-type and the second conductivity type is a p-type.

12. The vertical MOSFET structure of claim 1, wherein the drift region is negatively doped and the semiconductor substrate, the doped source, and the doped body region are positively doped.

13. The vertical MOSFET structure of claim 1, wherein both the doped source region and the doped body region have a greater doping concentration than the doped drift region.

14. The vertical MOSFET structure of claim 1, wherein the doped body has a doping concentration from $1\times10^{18}$ cm$^{-3}$ to $1\times10^{20}$ cm$^{-3}$.

15. The vertical MOSFET structure of claim 1, wherein the doped source has a doping concentration from $1\times10^{18}$ cm$^{-3}$ to $1\times10^{20}$ cm$^{-3}$.

16. The vertical MOSFET structure of claim 1, wherein the doped drift region has a doping concentration from $1\times10^{14}$ cm$^{-3}$ to $1\times10^{17}$ cm$^{-3}$.

17. An insulated gate bipolar transistor (IGBT) structure, comprising:
    a gate stack formed on a top surface of a semiconductor substrate of a first conductivity type, the gate stack comprising a gate dielectric adjacent to the top surface of the semiconductor substrate and a gate electrode formed over the gate dielectric, wherein the gate dielectric comprises a charge trapping material;
    a drain electrode formed on a bottom surface of the semiconductor substrate;
    a doped source region of a second conductivity type formed within the semiconductor substrate adjacent to and below outer portions of a bottom surface of the gate dielectric;

a doped body region of the first conductivity type formed within the semiconductor substrate around the doped source region and adjacent to and below inner portions of the bottom surface of the gate dielectric;

a source electrode formed on the top surface of the semiconductor substrate, lateral to a side surface of the gate stack, and short-connecting the doped body region and the doped source region; and a doped drift region of the second conductivity type formed around the doped body region and adjacent to and below a center portion of the bottom surface of the gate dielectric, wherein a vertical channel is established within the IGBT structure extending from the doped source region through the doped drift region to the drain electrode.

18. The IGBT structure of claim 17, wherein the gate dielectric comprises three layers comprising a bottom layer formed adjacent to the top surface of the semiconductor substrate, a middle layer formed adjacent to and above the bottom layer and a top layer formed adjacent to and above the middle layer, wherein the bottom layer comprises silicon oxide.

19. The IGBT structure of claim 18, wherein the middle layer comprises the charge trapping material.

20. The IGBT structure of claim 19, wherein the middle layer comprises at least one of silicon nitride or silicon nanocrystal.

21. The IGBT structure of claim 18, wherein the top layer comprises silicon oxide.

22. The IGBT structure of claim 18, wherein the top layer comprises aluminum oxide.

23. The IGBT structure of claim 18, wherein the charge trapping material has a thickness from about 10 nm to about 50 nm.

24. The IGBT structure of claim 17, wherein the first conductivity type is a p-type and the second conductivity type is an n-type.

25. The IGBT structure of claim 17, wherein the drift region is negatively doped and the semiconductor substrate, the doped source, and the doped body region are positively doped.

26. The IGBT structure of claim 17, wherein both the doped source region and the doped body region have a greater doping concentration than the doped drift region.

27. The IGBT structure of claim 17, wherein the doped body has a doping concentration from $1\times10^{18}$ cm$^{-3}$ to $1\times10^{20}$ cm$^{-3}$.

28. The IGBT structure of claim 17, wherein the doped source has a doping concentration from $1\times10^{18}$ cm$^{-3}$ to $1\times10^{20}$ cm$^{-3}$.

29. The IGBT structure of claim 17, wherein the doped drift region has a doping concentration from $1\times10^{14}$ cm$^{-3}$ to $1\times10^{17}$ cm$^{-3}$.

30. A power semiconductor field effect transistor (FET) structure, comprising:

a gate stack formed on a top surface of a semiconductor substrate of a first conductivity type, the gate stack comprising a gate dielectric adjacent to the top surface of the semiconductor substrate and a gate electrode formed over the gate dielectric, wherein the gate dielectric comprises a charge trapping material;

a drain electrode formed on a bottom surface of the semiconductor substrate;

a doped source region of the first conductivity type and a first doping concentration formed within the semiconductor substrate adjacent to and below outer portions of a bottom surface of the gate dielectric;

a doped body region of a second conductivity type and the first doping concentration formed within the semiconductor substrate around the doped source region and adjacent to and below inner portions of the bottom surface of the gate dielectric;

a source electrode formed on the top surface of the semiconductor substrate, lateral to a side surface of the gate stack, and short-connecting the doped body region and the doped source region; and a doped drift region of the first conductivity type and a second doping concentration lower than the first doping concentration formed around the doped body region and adjacent to and below a center portion of the bottom surface of the gate dielectric, wherein a vertical channel is established within the power semiconductor field effect transistor structure extending from the doped source region through the doped drift region to the drain electrode.

31. The power semiconductor FET structure of claim 30, wherein the gate dielectric comprises three layers comprising a bottom layer formed adjacent to the top surface of the semiconductor substrate, a middle layer formed adjacent to and above the bottom layer and a top layer formed adjacent to and above the middle layer, wherein the bottom layer comprises silicon oxide.

32. The power semiconductor FET structure of claim 31, wherein the middle layer comprises the charge trapping material.

33. The power semiconductor FET structure of claim 32, wherein the middle layer comprises at least one of silicon nitride or silicon nanocrystal.

34. The power semiconductor FET structure of claim 31, wherein the top layer comprises silicon oxide or aluminum oxide.

35. The power semiconductor FET structure of claim 31, wherein the charge trapping material has a thickness from about 10 nm to about 50 nm.

36. The power semiconductor FET structure of claim 30, wherein the first conductivity type is an n-type and the second conductivity type is a p-type.

37. The power semiconductor FET structure of claim 30, wherein the drift region is negatively doped and the semiconductor substrate, the doped source, and the doped body region are positively doped.

38. The power semiconductor FET structure of claim 30, wherein the first doping concentration is from $1\times10^{18}$ cm$^{-3}$ to $1\times10^{20}$ cm$^{-3}$.

39. The power semiconductor FET structure of claim 30, wherein the second doping concentration is from $1\times10^{14}$ cm$^{-3}$ to $1\times10^{17}$ cm$^{-3}$.

* * * * *

UNITED STATES PATENT AND TRADEMARK OFFICE
CERTIFICATE OF CORRECTION

| | | |
|---|---|---|
| PATENT NO. | : 8,981,460 B2 | |
| APPLICATION NO. | : 13/883753 | |
| DATED | : March 17, 2015 | |
| INVENTOR(S) | : Johnny Kin On Sin et al. | |

It is certified that error appears in the above-identified patent and that said Letters Patent is hereby corrected as shown below:

Claims

In claims 12, 25 and 37, the term "negatively doped" should be "lightly doped" and the term "positively doped" should be "heavily doped," as provided below:

Column 12, line 38
12. (Amended) The vertical MOSFET structure of claim 1, wherein the drift region is lightly doped and the semiconductor substrate, the doped source, and the doped body region are heavily doped.
Column 13, line 36
25. (Amended) The IGBT structure of claim 17, wherein the drift region is lightly doped and the semiconductor substrate, the doped source, and the doped body region are heavily doped.
Column 14, line 48
37. (Amended) The power semiconductor FET structure of claim 30, wherein the drift region is lightly doped and the semiconductor substrate, the doped source, and the doped body region are heavily doped.

Signed and Sealed this
First Day of December, 2015

Michelle K. Lee
*Director of the United States Patent and Trademark Office*